Figure 1:
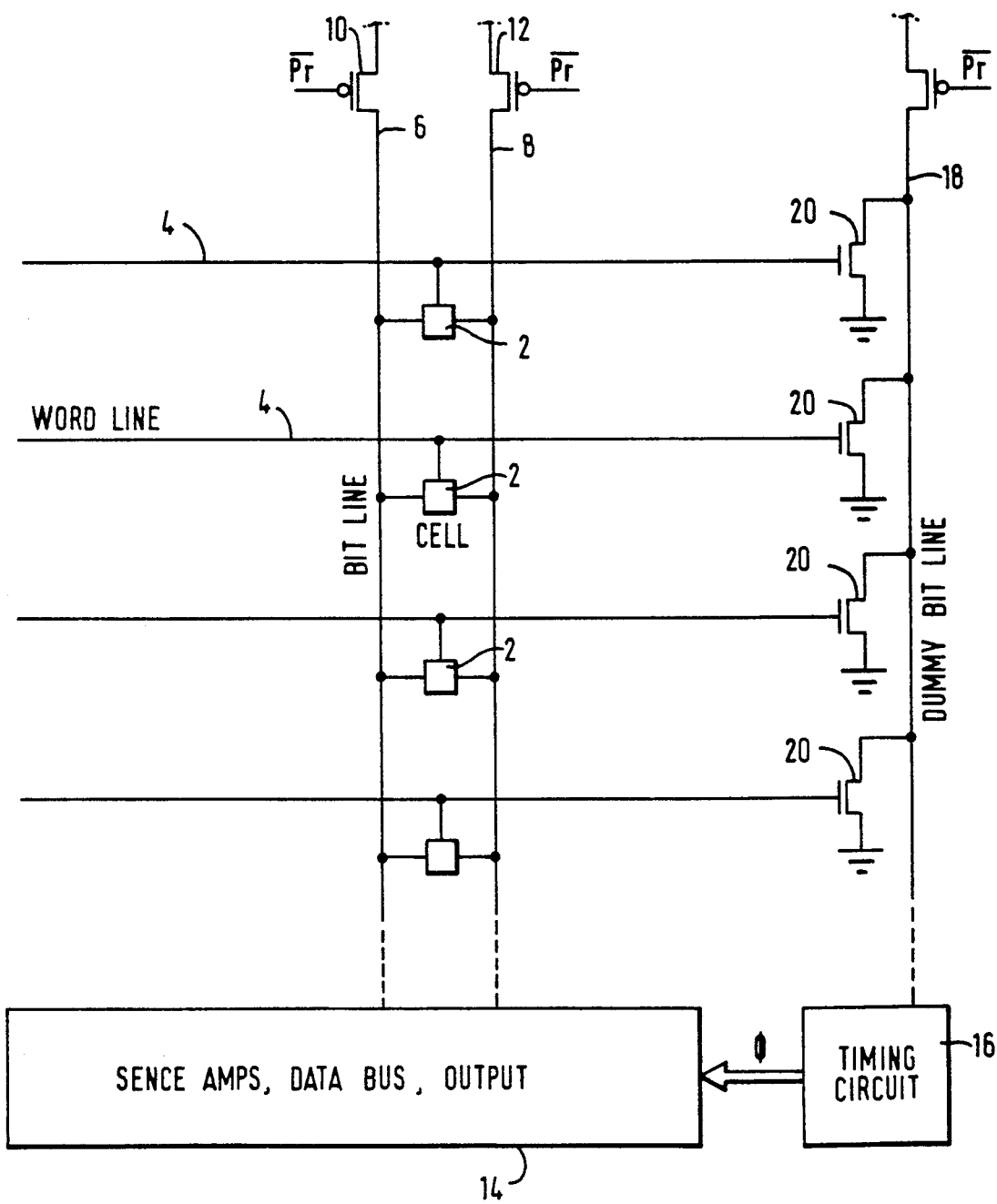

United States Patent [19]

Ferris et al.

[11] Patent Number: 5,268,869
[45] Date of Patent: Dec. 7, 1993

[54] TIMING CONTROL FOR A MEMORY

[75] Inventors: Andrew T. Ferris, Bristol; Gordon S. Work, Warrington, both of United Kingdom

[73] Assignee: Inmos Limited, Bristol, United Kingdom

[21] Appl. No.: 596,200

[22] Filed: Oct. 11, 1990

[30] Foreign Application Priority Data

Oct. 12, 1989 [GB] United Kingdom ............... 8923037

[51] Int. Cl.[5] .............................................. G11C 7/00
[52] U.S. Cl. ................................ 365/210; 365/225.7; 365/233; 437/52
[58] Field of Search ................... 365/210, 233, 225.7, 365/200, 201; 437/52

[56] References Cited

U.S. PATENT DOCUMENTS

| 4,255,679 | 3/1981 | White, Jr. et al. ............... 307/355 |
| 4,363,111 | 12/1982 | Heightley et al. ............... 365/210 |
| 4,425,633 | 1/1984 | Swain ........................... 365/194 |

FOREIGN PATENT DOCUMENTS

| 0124868 | 11/1984 | European Pat. Off. . |
| 0124868 | 11/1984 | European Pat. Off. . |
| WO85/1024-85 | 6/1985 | PCT Int'l Appl. . |

*Primary Examiner*—Joseph A. Popek
*Attorney, Agent, or Firm*—Edward D. Manzo; David Lucente

[57] ABSTRACT

A memory circuit comprises a plurality of memory cells (2) arranged in rows and columns, the cells in each row being connected to a common wordline (4) and the cells in each column being connected between a pair of bit lines (6,8) across which a voltage differential is developed when a memory cell is accessed to be read; and a timing circuit (16) for producing a timing signal to control further circuitry in dependence on said voltage differential achieving a predetermined value. The memory circuit has a dummy bit line connected to a column of dummy cells, each dummy cell having the same structure as a memory cell. A plurality of said dummy cells (22) has a bit value stored therein and is connected to a dummy wordline and the remainder of said dummy cells are rendered inactive, whereby on addressing of the dummy wordline simultaneously with the wordline of an accessed cell, a predetermined number of dummy cells discharges via the dummy bit line so that the voltage developed on the dummy bit line bears a predetermined relationship to the voltage differential developed between the bit lines of the accessed cell. The timing circuit (16) is connected to receive the voltage differential on the dummy bit line (18).

17 Claims, 5 Drawing Sheets

TIMING CONTROL FOR A MEMORY

FIELD OF THE INVENTION

The present invention relates to timing control for a memory.

BACKGROUND TO THE INVENTION

Existing semiconductor memories have read circuitry connected between the output data lines of the memory and operable to sense the bit value ("1" or "0") of a selected cell by sensing the voltage differential which has developed across the data lines. When a dynamic sensing amplifier is used as the read circuitry, this voltage differential is sensed after a predetermined time has lapsed from accessing the cell. This predetermined time is controlled by a timing circuit coupled to the read circuitry. It is important to sense reliably a sufficient voltage differential to avoid the risk of bad data being passed to the output; once clocked, a dynamic sense amplifier cannot recover. Conventionally, excessive safety margins are built into the timing chain to avoid this.

In theory it would be possible for the cycle of the timing signal produced by the timing circuit to be predetermined and invariable, based on knowledge of the memory structure and its likely behaviour, i.e. the likely time for a sufficient voltage differential to be developed for sensing. However this is unsatisfactory for several reasons.

Firstly, process tolerances involved in the manufacture of memories mean that any two memories may not have identical behaviour, so that the time required for an adequate differential voltage for sensing by the read circuitry to develop between the data lines may vary from memory to memory. If an invariable timing signal is used, there is the danger that for some memories the timing period will be too short, resulting in bad data being sensed. In other cases it will be longer than is required for the reliable sensing of data thereby unnecessarily slowing down the memory.

Secondly, the behaviour of a semiconductor memory changes in dependence on the environmental conditions, e.g. temperature, in which it operates. Such changes can affect the timing circuit in an adverse manner.

A known arrangement for partially addressing these problems is shown in FIG. 1. In FIG. 1 part of a memory circuit is shown diagrammatically. The memory circuit comprises a plurality of memory cells arranged in rows and columns, all the cells 2 in a row being connected to a common wordline 4 and all the cells in a column being connected between a pair of bit lines 6,8. FIG. 1 also shows precharge transistors 10,12 associated respectively with the bit lines 6,8. Read circuitry and memory output circuitry is indicated diagrammatically by the box 14. The read and output circuitry 14 is controlled by a timing circuit 16.

The timing circuit 16 provides a timing signal $\phi$ to the read and output circuitry 14 to control the time after accessing a cell at which the voltage differential developed across the bit lines 6,8 is read by the read circuitry. In an attempt to overcome the problems discussed above, the timing signal $\phi$ produced by the timing circuit 16 is made responsive to the operational conditions of the memory itself by receiving as a control input the voltage developed on a so-called "dummy bit line" 18. The precharge transistors 10,12 serve to precharge the bit lines 6,8 and the dummy bit line 18 to the same predetermined voltage, generally the supply voltage, prior to sensing.

To the dummy bit line 18 are connected a plurality of field effect transistors 20, the gates of which are coupled respectively to the wordlines 4 of the memory array. The drains of the transistors 20 are connected to the dummy bit line 18 and their sources are connected to ground. The transistors 20 act as pull-down devices: whenever a wordline 4 is driven high, the dummy bit line will be discharged through the associated pull-down device.

The timing circuit 16 includes a differential voltage detector which can detect when a predetermined voltage has manifested itself on the dummy bit line. Such differential voltage detectors are known, but operate satisfactorily only with an input voltage at least of the order of 1 or 2 volts. In contrast, the voltage differential across the bit lines might be 200-300 mV. The concept underlying the arrangement of FIG. 1 is that the voltage developed on the dummy bit line 18 should be at a predetermined relationship to the voltage differential developed across the bit lines 6,8 associated with the column of the accessed memory cell. In this way, any changes in the time taken for a satisfactory voltage differential to be developed across the bit lines 6,8 are matched by the voltage developing on the dummy bit line and so the timing circuit is adjusted accordingly.

Although the underlying concept is sound, the implementation shown in FIG. 1 is unsatisfactory. To achieve a situation in which the dummy bit line 18 accurately models the behaviour of the real bit lines 6,8 of the memory array, it is necessary that it should satisfy two criteria:

(a) the capacitance of the dummy bit line must be substantially the same as a real bit line; and
(b) the discharge rate of the dummy bit line should have a predetermined relationship with the discharge rate of a real bit line.

The simultaneous satisfaction of these two criteria cannot be achieved with the implementation shown in FIG. 1. The capacitance of the real bit lines 6,8 is determined by the size and layout of the transistors in the memory cell 2 (referred to herein as the transistor structure of the cell). Ideally therefore the size of each of the transistors 20 should be as close as possible to the size of a transistor in a memory cell 2. However, even then, a true capacitance match is not achieved since the capacitance of the real bit line is dependant on the layout associated with a real cell and the capacitance of the dummy bit line is dependant on the layout of the single transistor, 20, and these cannot be the same. Further, if transistors of the same size as those in the memory cell are used for the pull-down devices, the discharge rate too will be substantially the same, providing a differential input to the timing circuit of the order of 100 mV, which is difficult to detect. The discharge rate must hence be increased (by increasing the size of the transistors 20) but this further upsets the capacitance match with the real bit line.

A further difficulty arises with the arrangement of FIG. 1 in that the drive characteristics of the transistors 20 do not model the active cells connected to the memory bit lines. The discharge path in a memory cell consists of a pass device in series with a latch device. The pass device is a transistor of small width, with the result that any small offset in width introduced in the manufacturing process gives rise to a large percentage of offset in the drive characteristic of the cell. However, as the transistors 20 have a larger width, the offsets in width introduced by the same manufacturing process will not have the same effect on their drive characteristic.

Also, the factor by which the voltage developed on the dummy bit line multiplies the differential voltage developed across the bit lines 6,8 is predetermined by the size of the transistors 20. If it is desired to change this factor, it may be necessary to change several, perhaps three, masks used during the manufacturing process to make the necessary adjustments to the transistors 20.

Figure 2:
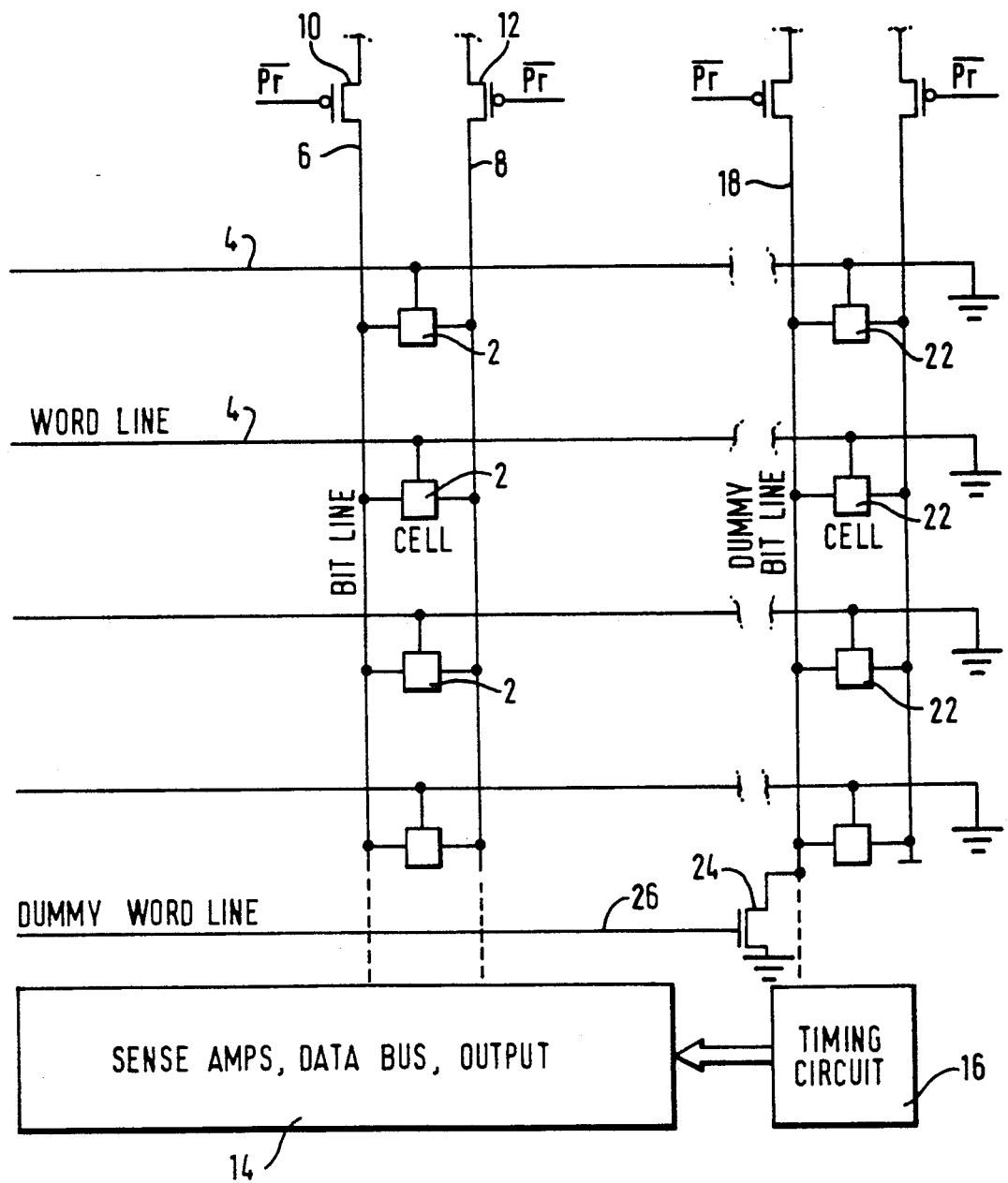

An improvement on the arrangement shown in FIG. 1 is illustrated in FIG. 2. For the sake of consistency, the same reference numerals in FIG. 2 represent the same components as in FIG. 1. These components will not be described again. In the embodiment of FIG. 2, the transistors 20 have been replaced by dummy cells 22. These are cells which have the same transistor structure as the memory cells 2 and therefore closely match the capacitance characteristics of the real cells. These dummy cells are rendered inactive by the connection of their wordline to ground.

When a real memory cell 2 is accessed, discharge of the dummy bit line 18 is achieved through a pull-down transistor 24 the gate of which is connected to a dummy wordline 26 which is driven high simultaneously with the accessing wordline 4. While this enables the capacitance of the dummy bit line to match more closely that of the real bit lines, the difficulties relating to the drive characteristics of the pull-down transistor 24 remain unaddressed. There also remains the problem that any changes in timing must be effected by changing the size of the pull-down transistor 24 at the manufacturing stage.

It is not possible therefore with either of the arrangements shown in FIGS. 1 or 2 to provide truly controllable and accurate timing for a memory.

SUMMARY OF THE INVENTION

According to one aspect of the present invention there is provided a memory circuit comprising: a plurality of memory cells arranged in rows and columns, the cells in each row being connected to a common wordline and the cells in each column being connected between a pair of bit lines across which a voltage differential is developed when a memory cell is accessed to be read; and a timing circuit for producing a timing signal to control further circuitry in dependence on said voltage differential achieving a predetermined value, the timing circuit being connected to receive the voltage developed on a dummy bit line of the memory circuit wherein said dummy bit line is connected to a column of dummy cells, each dummy cell having the same structure as a memory cell, a plurality of said dummy cells having a bit value stored therein and being connected to a dummy wordline and the remainder of said dummy cells being rendered inactive, whereby on addressing of the dummy wordline simultaneously with the wordline of an accessed cell, the dummy bit line is discharged via the dummy cells so that the voltage developed on the dummy bit line bears a predetermined relationship to the voltage differential developed between the bit lines of the accessed cell.

It will be apparent that the relationship between the voltage developed on the dummy bit line and the bit line voltage differential dependent on the number of dummy cells in said plurality and which have a bit value stored therein and which are connected to the dummy wordline. For example, if there are five such cells the voltage developed on the dummy bit line will be five times that of the voltage differential developed between the memory bit lines. A high degree of accuracy is achieved since the dummy cells connected to the dummy bit line are identical in structure to the real cells. Hence the discharge rate of the dummy bit line tracks that of the real bit line, (but multiplied by the number of dummy cells utilised). Any changes in the behaviour of the real memory cells due to process tolerances or changes in environmental conditions are accurately taken into account by the timing circuit. This has particular advantages where said further circuitry utilising the timing signal is a dynamic sense amplifier for reading data from the memory, since with the present invention in the preferred embodiment, this can be consistently clocked at precisely the right moment to sense an adequate voltage differential between the bit lines.

The voltage on the dummy bit line will decrease linearly, and at a rate which is a multiple of the bit line voltage differential, until the operating region of the active pass transistors in the dummy cells changes from the saturation region to the resistive region at which time the rate of voltage decrease on the dummy bit line will be reduced. After this time the relationship between the voltage on the dummy bit line and the bit line voltage differential will not be an exact multiple but will nevertheless be well defined.

According to another aspect of the invention there is provided a method of manufacturing an integrated circuit memory device, the method comprising:
 (a) manufacturing as an integrated circuit a plurality of memory cells arranged in rows and columns;
 (b) causing connections to be made to said cells such that all the cells in one row are connected to a common memory wordline and the cells in each column are connected between respective pairs of bit lines;
 (c) forming a column of dummy cells connected to a dummy bit line, each dummy cell having the same structure as a memory cell;
 (d) storing a bit value in a plurality of said dummy cells; and
 (e) causing a set of said plurality of dummy cells with a bit value stored therein to be connected to a dummy wordline accessible with said memory wordline.

A further significant advantage arises in the manufacture of memory circuits according to the present invention. Manufacture of the whole memory circuit is facilitated since the dummy cells and the dummy bit line can be formed merely by replicating an existing column of the memory and modifying the active cells in order that they store a fixed bit value. Also, the number of dummy cells connected to the dummy wordline can be determined at the last stage of the manufacturing process by altering a single metal mask, i.e. the mask providing the dummy wordline tracks. The number of dummy cells attached to the dummy wordline can also be controlled by the provision of fuses which can selectively be blown.

The invention has a further application for "static" memories. When the read circuitry of a memory comprises a static sensing amplifier, the latter continually monitors the voltage differential on the data lines and provides an output as quickly as possible. To provide an adequate output, the sensing amplifier has several amplification stages. The speed at which an adequate output is produced is determined by the gain and capacitance on the respective outputs of each amplification stage of the sensing amplifier. To speed up the overall operation, static sensing amplifiers are usually clocked to clear previously sensed data thereby to start a next sensing operation from a neutral state.

A particular problem arising with static sensing amplifiers is that of incorrect data excursions at the output, so-called "push-out". If, due to mismatches, the voltage differential across the data lines initially develops in the wrong sense, this will be amplified to produce an output in the wrong sense. As the drive of the accessed cell increases to overcome the mismatch and the voltage differential across the data lines begins to develop in the correct sense, the sensing amplifier first has to drive its output to counter the wrong sense before it can begin to provide the correct voltage output. The time which this takes is dependent on the output capacitance of each amplification stage and is termed "push-out". The present invention in one embodiment can be used to hold the sensing amplifier until the cell is guaranteed to have overcome mismatches, thereby eliminating push-out. The correct timing can be achieved by repeated testing of subsequent batches of memories as described in more detail in the following specific description.

Figure 3:
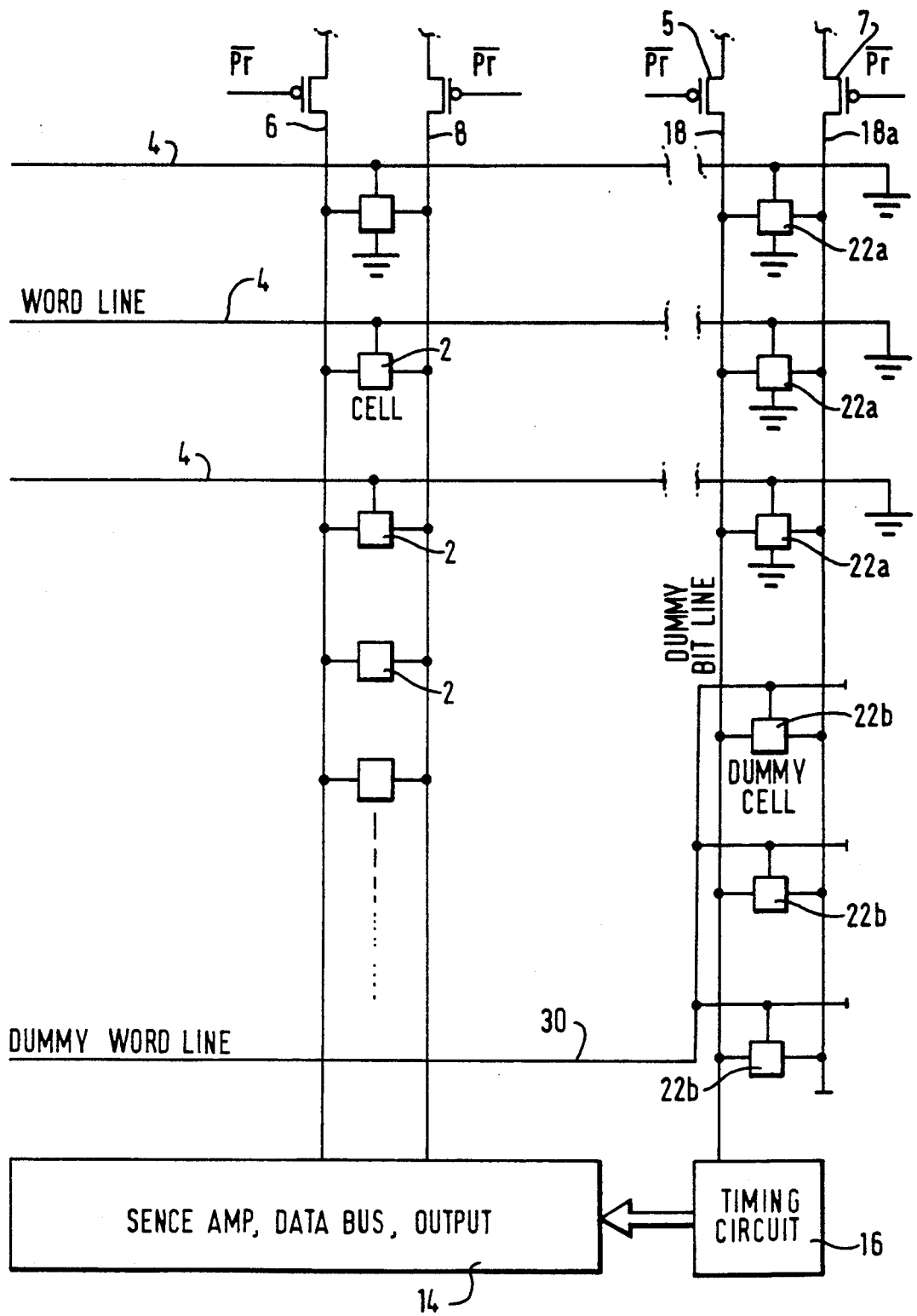
Figure 4:
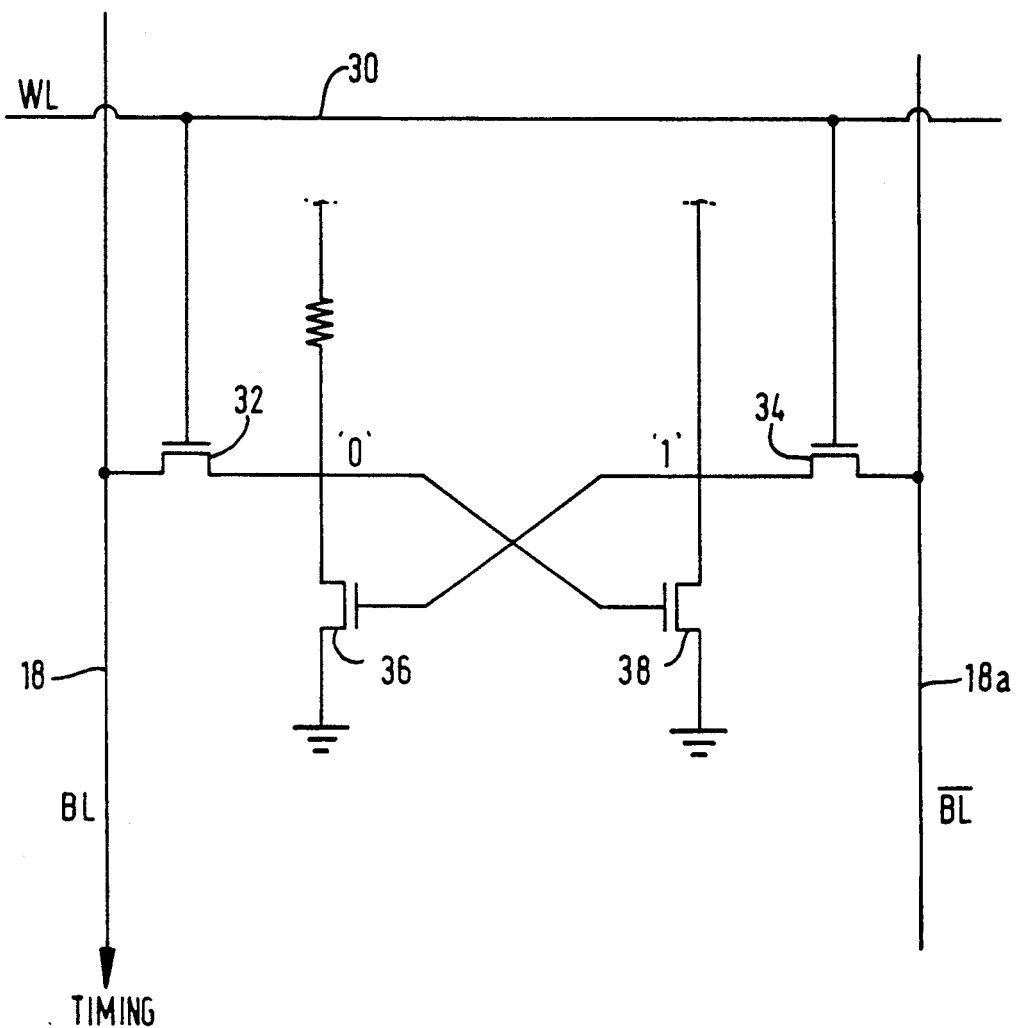
Figure 5:
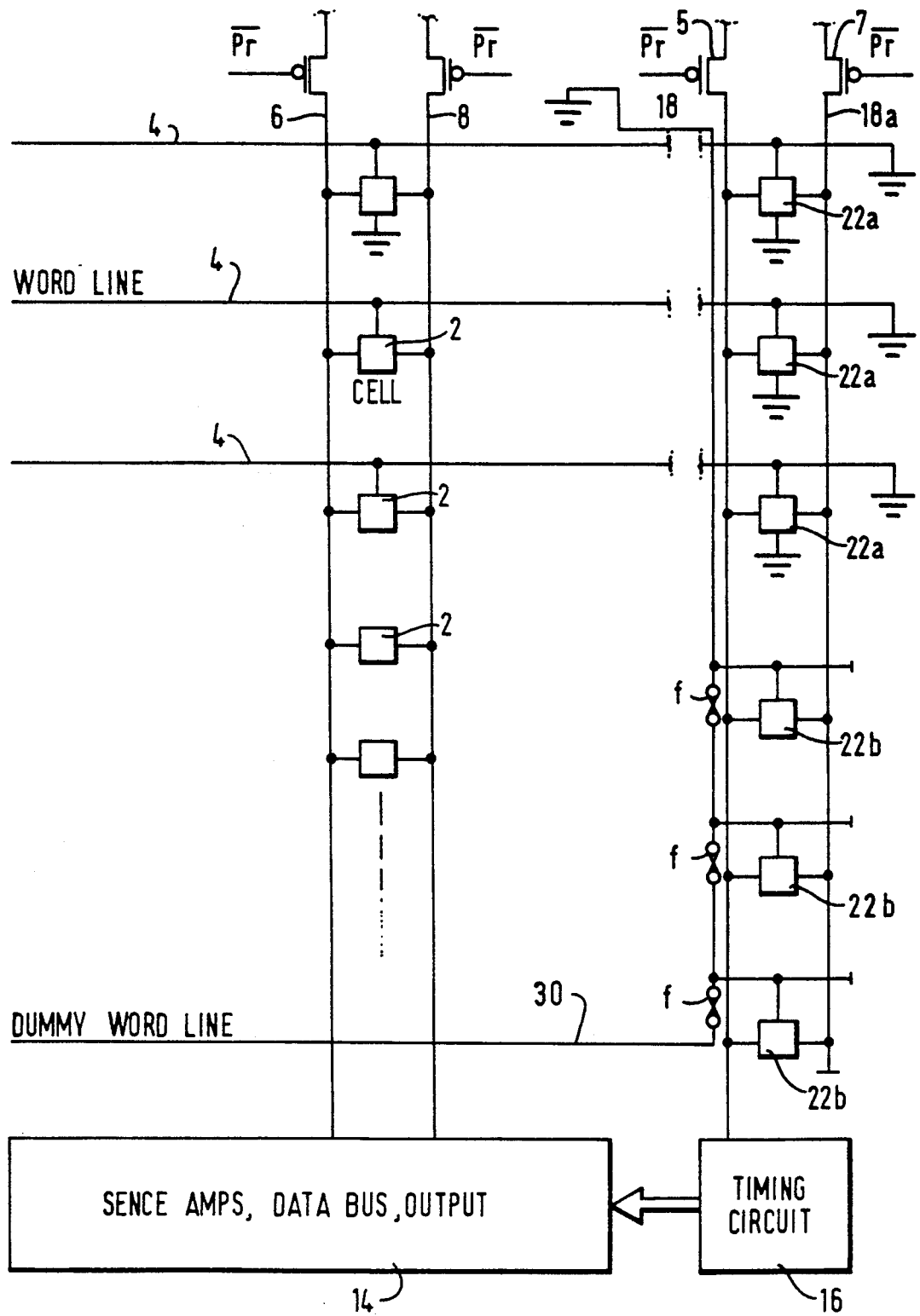

For a better understanding of the present invention, and to shown how the same may be carried into effect, reference will now be made, by way of example, to the accompanying drawings, in which:

FIG. 1 shows a known memory circuit;
FIG. 2 shows an improved version of the circuit of FIG. 1;
FIG. 3 shows a memory circuit in accordance with one embodiment of the present invention;
FIG. 4 shows the structure of a dummy cell; and
FIG. 5 shows a memory circuit in accordance with another embodiment of the present invention.

FIGS. 1 and 2 have been discussed above and will not be described further herein.

However, for the sake of consistency reference numerals used in FIGS. 3 and 4 are the same as those used in FIGS. 1 and 2 for the same parts. The memory circuit comprises a plurality of memory cells 2 arranged in rows and columns, the cells in each row being connected to a common wordline 4 and the cells in each column being connected between a pair of bit lines 6,8. Output circuitry, including read circuitry, is indicated generally by the box designated by reference numeral 14. A column of cells is replicated in the manufacturing process to provide a column of dummy cells 22, and at that stage some of the cells are modified to store a bit value as described herein after. These dummy cells 22 are connected to a dummy bit line 18 which supplies an input to a timing circuit 16. Precharge transistors 5,7 are provided on the dummy bit line 18 and its pair 18a respectively to precharge the bit line 18 prior to sensing. The timing circuit includes a voltage detector which detects when the voltage developed on the dummy bit line 18 reaches a predetermined value, and produces a timing signal. The number of dummy cells attached to the dummy bit line is the same as the number of cells in a column of the memory. For example, this might be 256. The wordlines associated with the dummy cells are disconnected from the main wordline 4 of the memory. There are two types of dummy cells attached to the dummy bit line. The first type indicated in FIG. 3 by numeral 22a are rendered inactive by connecting their wordlines to ground. Effectively the cells are in a "don't care" state. In contrast, the second type comprises a predetermined set of cells (designated by numeral 22b in FIG. 3), any number of which can be selected to have their wordlines connected to a common dummy wordline 30 and the remainder having their wordlines connected to ground. In practice, this set can comprise 32 cells. Each cell in this set of cells 22b is a replica of a real cell modified to store permanently a bit value, i.e. one or zero. This can be achieved by removing one of the resistor implants in the cell. It is of no consequence what bit value is stored, except that it must be ensured that the bit line 18 connected to the timing circuit 16 will be discharged (and not its pair 18a). FIG. 3 shows an embodiment in which the selected ones of the dummy cells 22b are connected to a dummy wordline by a metallization mask. FIG. 5 shows a case where they are connected initially by fuses F, which can selectively be blown to break the connections prior to testing.

The structure of a cell 22b of the second type is shown in FIG. 4, in which a zero is stored. The cell comprises two pass transistors 32,34 connected or connectable to the dummy wordline 30 and two cross-coupled latch transistors 36,38. The drains of the pass transistors 32,34 are connected respectively to the dummy bit line 18 and to its pair 18a. The number of dummy cells 22b of the second type, which are connected to the wordline 30 is controlled during manufacturing at the final mask stage. This number relates directly to the factor by which the discharge rate of the dummy bit line 18 multiplies that of the real bit lines 6,8 when a memory cell is accessed and while the transistors in the dummy cells are in their linear region of operation. This is arranged so that the voltage detected by the voltage detector in the timing circuit at the time of producing the timing signal bears a predetermined relationship to the voltage differential which can be reliably sensed by the read circuitry associated with the memory circuit.

The ease with which the number of dummy cells connected to the dummy wordline can be altered enables the operating speed of the memory circuit to be optimised in a way which has not hithertofore been possible. The performance of dynamic sense amplifiers manufactured to a particular design (see for example copending U.S. Ser. No. 562,105 (Page White & Farrer Ref: 66376) depends on the manufacturing process, and from batch to batch the lowest possible voltage differential which can consistently be sensed varies. It has always been necessary however to design the memory around the maximum "safe" voltage differential, thereby effectively wasting the opportunities presented by smaller, lower power dynamic sense amplifiers. Using the memory circuit described herein, it is possible to utilise each dynamic sense amplifier to its maximum potential. That is, after a batch of memory cells has been produced and tested, if it is found that all or nearly all of the memory circuits are operating satisfactorily within the parameters set at the manufacturing stage, that is with a predetermined differential voltage between the bit lines of an accessed cell at the time at which the sense amplifier is clocked to read the data, the assumption is made that a proportion of the memory circuits produced by that process might also work with a slightly lower predetermined voltage differential at the time the sense amplifier is clocked for reading data. For the next batch of memory circuits, therefore, it is a simple matter with memory circuits according to an embodiment of the present invention to increase the number of dummy cells connected to the wordline thereby to increase the rate at which the dummy bit line discharges and hence to decrease the time taken for the voltage to reach a value at which the differential voltage detector of the timing circuit producing a timing signal. This reduces the voltage differential developed across the bit lines at the time at which the sense amplifier is clocked for reading data. This batch by batch produce and test procedure can be repeated to achieve memory circuits operating with the lowest possible voltage differential between the memory bit lines that can reliably be sensed by the particular sense amplifier of that batch. Of course, the lower this differential, the shorter the time required to achieve it and therefore the lower the access time of memory.

Alternatively, if after producing a batch of memory circuits it is discovered that none or only a small proportion work satisfactorily, the next batch will be produced with a lower number of dummy cells connected to the dummy wordline. This has the effect of increasing the voltage differential between the bit lines at the time of sensing. This number is increased for subsequent batches until an adequate number of memory circuits are successful after testing.

It is therefore possible with a single manufacturing process and without significant design changes to the memory circuit to provide both fast and slow memory circuits and thereby to address simultaneously two different market sectors. Slow circuits generally have a higher yield but command a lower price, while fast circuits have a smaller yield but command a higher price.

A similar batch by batch produce and test procedure can be utilised to optimise memories using static sensing amplifiers.

We claim:

1. A memory circuit comprising:
    a memory array having a plurality of memory cells arranged in rows and columns, the cells in each row being connected to a common wordline and the cells in each column being connected between a pair of bit lines across which a voltage differential is developed when a memory cell is accessed to be read;
    a dummy bit line having a plurality of dummy cells connected thereto, each dummy cell having the same structure as a memory cell; and
    a timing circuit for producing a timing signal, said timing circuit being connected to receive a voltage developed on said dummy bit line and comprising a voltage detector for detecting when said voltage reaches a predetermined value,
    a plurality of said dummy cells having a bit value stored therein and being connected to a dummy wordline the remainder of said dummy cells being rendered inactive,
    whereby on addressing of the dummy wordline simultaneously with the wordline of an accessed memory cell, the dummy bit line is discharged via said plurality of dummy cells connected to the dummy wordline, the discharge rate of each dummy cell tracking the discharge rate of a memory cell so that the voltage developed on the dummy bit line bears a predetermined relationship to the voltage differential developed between the bit lines of the accessed cell.

2. A memory circuit as claimed in claim 1, wherein the memory circuit is provided on a semiconductor chip.

3. A memory circuit as claimed in claim 2 further including access circuitry coupled to the memory array for reading data from an accessed memory cell, the access circuitry being coupled to the timing circuit to receive said timing signal.

4. A memory circuit as claimed in claim 1 further comprising access circuitry coupled to the memory array for reading data from an accessed memory cell, the access circuitry being coupled to the timing circuit to receive said timing signal.

5. A memory circuit as claimed in claim 4 wherein said access circuitry includes a dynamic sense amplifier.

6. A method of manufacturing a memory device, the method comprising the steps of:
    (a) forming on a substrate a plurality of memory cells arranged in rows and columns such that all the cells in one row are connected to a common memory wordline and the cells in each column are connected between a pair of bit lines;
    (b) forming dummy bit line and a column of dummy cells connected to said dummy bit line, each dummy cell having the same structure as a memory cell;
    (c) arranging a plurality of said dummy cells to each represent a particular bit value;
    (d) processing the memory device to provide connections so that a set of said plurality of dummy cells arranged to represent a particular bit value are connected to a dummy wordline accessible with said memory wordline.

7. A method as claimed in claim 6, in which said set of dummy cells to be connected to the dummy wordline in step (d) is selected after testing the memory device to determine its speed of operation.

8. A method as claimed in claim 7, in which step (d) is carried out by defining in a metalization mask a plurality of connection regions for connecting said set of said plurality of dummy cells to the dummy wordline and performing a metalization step to form connectors at said connection regions.

9. A method as claimed in claim 7, in which step (d) is carried out by blowing selected ones of fuses connecting said plurality of dummy cells to said dummy wordline.

10. A method of manufacturing a memory device as claimed in claim 6, further comprising the steps of:
    forming on said substrate a timing circuit connected to receive a voltage developed on said dummy bit line; and
    detecting with a voltage detector when said voltage reaches a predetermined value.

11. In an integrated circuit memory device having a plurality of memory cells and at least one wordline, a column of dummy cells connected to a dummy bit line, each dummy cell having the same structure as said memory cells, a plurality of said dummy cells having a fixed bit value stored therein and some or all of said plurality of dummy cells being connected to a dummy wordline, said dummy wordline being addressable simultaneously with at least one said wordline of the memory.

12. An integrated circuit memory device comprising a plurality of memory cells and at least one wordline, a column of dummy cells connected to a dummy bit line, each dummy cell having the same structure as said memory cells, a plurality of said dummy cells having a fixed bit value stored therein with the remainder of said dummy cells being rendered inactive and some or all of said plurality being connected to a dummy wordline, said dummy wordline being addressable simultaneously with at least one said wordline of the memory device.

13. A batch method of manufacturing memory devices comprising the steps of:
   (a) manufacturing a first batch of memory devices wherein each memory device has a plurality of memory cells arranged in rows and columns such that all the cells in one row are connected to a common memory wordline and the cells in each column are connected between a pair of bit lines, and a column of dummy cells connected to a dummy bit line, each dummy cell having the same structure as memory cells of the memory; in which a plurality of said dummy cells are each arranged to represent a particular bit value, and a set of said plurality of dummy cells each arranged to represent a particular bit value are connected to a dummy word line accessible with word lines of the memory;
   (b) testing at least one memory device from said first batch to determine its speed of operation; and
   (c) on the basis of the determined speed of operation, manufacturing a next batch of memory devices in which said set of said plurality of dummy cells connected to the dummy word line contains a different number of dummy cells.

14. A memory circuit comprising:
   a memory array having a plurality of memory cells arranged in rows and columns, the cells in each row being connected to a respective common wordline, the cells in each column being connected to a respective bit line on which a first voltage is developed when a memory cell connected thereto is accessed to be read; and
   a timing circuit for producing a timing signal, said timing circuit being connected to receive a second voltage developed on a dummy bit line of the memory circuit,
   the timing circuit including a voltage detector for detecting when said second voltage reaches a predetermined value.
   wherein said dummy bit line is connected to a column of dummy cells, each dummy cell having the same structure as a memory cell, a plurality of said dummy cells having a bit value stored therein and being connected to a dummy wordline and the remainder of said dummy cells being rendered inactive,
   whereby on addressing of the dummy wordline simultaneously with the wordline of an accessed cell, the dummy bit line is discharged via said plurality of dummy cells having a bit value stored therein and being connected to a dummy wordline and the remainder of said dummy cells being rendered inactive,
   whereby on addressing of the dummy wordline simultaneously with the wordline of an accessed cell, the dummy bit line is discharged via said plurality of dummy cells wherein the discharge rate of each dummy cell tracks the discharge rate of a memory cell so that the second voltage developed on the dummy bit line has a predetermined relationship to the first voltage developed between the bit lines of the accessed cell.

15. In integrated circuit SRAM device having a plurality of memory cells and at least one wordline, the improvement comprising:
   a dummy wordline addressable simultaneously with a wordline of the memory;
   a column of dummy cells connected between a pair of dummy bit lines, each dummy cell having the same structure as memory cells of the memory, a plurality of dummy cells being connected to said dummy wordline; and
   a timing circuit connected to receive the voltage developed on one of said dummy bit lines.

16. In integrated circuit SRAM device having a plurality of memory cells and at least one wordline, the improvement comprising:
   a dummy wordline addressable simultaneously with a wordline of the memory;
   a column of dummy cells connected between a pair of dummy bit lines, each dummy cell having the same structure as memory cells of the memory device, a plurality of said dummy cells having a fixed bit value stored therein with the remainder of said dummy cells being rendered inactive and some or all of said plurality being connected to said dummy wordline; and
   a timing circuit connected to receive the voltage developed on one of said dummy bit lines.

17. A method of manufacturing a memory device, the method comprising the steps of:
   (a) forming on a substrate a plurality of memory cells arranged in rows and columns such that all the cells in one row are connected to a respective common memory wordline and the cells in each column are connected to a respective bit line;
   (b) forming a column of dummy cells connected to a dummy bit line, each dummy cell having the same structure as a memory cell;
   (c) arranging a plurality of said dummy cells each to represent a particular bit value; and
   (d) processing the memory device to provide connections so that a set of said plurality of dummy cells arranged to represent a particular bit value are connected to a dummy wordline accessible with said memory wordline and forming on said substrate a timing circuit connected to receive the voltage developed on said dummy bit line and including a voltage detector for detecting when said voltage reaches a predetermined value.

* * * * *